United States Patent
Ejima et al.

[11] Patent Number: 5,805,219
[45] Date of Patent: Sep. 8, 1998

[54] APPARATUS CAPABLE OF SAFELY RECORDING AN INFORMATION WHEN REMOVING A RECORDING MEDIUM

[75] Inventors: Satoshi Ejima, Tokyo; Koichiro Kawamura, Ichihara, both of Japan

[73] Assignee: Nikon Corporation, Tokyo, Japan

[21] Appl. No.: 516,484

[22] Filed: Aug. 17, 1995

[30] Foreign Application Priority Data

Feb. 14, 1995 [JP] Japan ................................... 7-025589

[51] Int. Cl.⁶ .................................................. H04N 5/225
[52] U.S. Cl. ........................... 348/375; 348/233; 361/737
[58] Field of Search ............................. 439/489, 924.1; 361/791, 607, 684, 686, 737; 348/231, 232, 233, 375; 358/906, 909.1; 235/487, 492, 475; H04N 5/225

[56] References Cited

U.S. PATENT DOCUMENTS

| | | | |
|---|---|---|---|
| 4,986,618 | 1/1991 | Wakatsuki | 312/276 |
| 5,091,787 | 2/1992 | Watanabe et al. | 348/233 |
| 5,092,799 | 3/1992 | Kimura | 439/924.1 |
| 5,179,505 | 1/1993 | Matsuo | 348/233 |
| 5,627,587 | 5/1997 | Murata et al. | 348/233 |

FOREIGN PATENT DOCUMENTS 2-54388  2/1990  Japan.

*Primary Examiner*—Andrew I. Faile
*Assistant Examiner*—Tuan V. Ho
*Attorney, Agent, or Firm*—Oliff & Berridge, PLC

[57] ABSTRACT

An apparatus is capable of using a detachable recording medium. The apparatus has an electrical contact point that is electrically connected with the recording medium for a predetermined length in the recording medium insertion and ejection directions. An eject mechanism is incorporated to enable eject of the recording medium. A first detection device detects an ejecting movement of the recording medium at a first time. The first time is earlier than a break time when the electrical contact points is electrically disconnected from the recording medium. A second detection device detects the ejecting movement of the recording medium at a second time. The second time is earlier than the break time and later than the first time. The apparatus is capable of accomplishing necessary safety measures when the recording medium is ejected during data recording.

37 Claims, 10 Drawing Sheets

APPARATUS CAPABLE OF SAFELY RECORDING AN INFORMATION WHEN REMOVING A RECORDING MEDIUM

BACKGROUND OF THE INVENTION

1. Field of the invention

The present invention relates to an apparatus capable of using a detachable recording medium.

2. Description of the related art

A conventional apparatus that records image data or voice data to a memory chip housed in a memory cartridge is developed in recent years. The electrical contact point is an electrical contact point socket on the memory cartridge receiving an electrical contact point pin from the apparatus. The conventional apparatus is provided with the eject mechanism that electrically disconnects the socket-to-pin connection and ejects the memory cartridge from the apparatus, as shown in Japanese Patent Laid-Open Publication Serial No. Heisei 2-54388.

The memory cartridge can be ejected during the process of recording grouped data, such as the image data of one frame of the photographic image plane (hereafter a file). Various types of data necessary for file management are recorded at the end of the file. Thus, the data recording of the file cannot be completed until the file ends. If the file management data is missing, various types of undesirable conditions are created. For example, one file being formally recorded cannot be distinguished from the various types of data written in the memory area of the memory cartridge. Therefore, the file cannot be re-produced. Further, if the end position of one file is not clear, additional recording cannot be made. The recording method called "daisy chain", where a continuous plural number of files are recorded, requires the address data of the next file to be entered at the end of the previous file. If the next address data is lost, the following files cannot be read.

To solve the problems described above, entering the management data forcefully even in the middle of the file has been considered. First, starting of the eject movement of the eject mechanism is detected. Then, the time from the detection point until the electrical contact point for data recording is disconnected is used to forcefully record file management data. However, the management data cannot always be entered accurately during the short period of time from the detection of the eject movement during data recording to the disconnection of the electrical contact point. Further, not only minimal file management data, but additional preferable management data cannot be recorded to the memory cartridge. Also, no structured control can be done concerning the memory cartridge. Limiting the file management data quantity to ensure complete recording during the extremely short time duration of the recording medium eject movement makes the functional capabilities of the management data insufficient.

Because of slight variations in the contact length of the electrical contact point, the data recording signal can become abnormal at the point of time when the electrical contact point for grounding is initially disconnected. Therefore, not only can the data being recorded be destroyed, but also abnormalities can be created in the recorded data in the memory cartridge or the apparatus.

SUMMARY OF THE INVENTION

A purpose of the present invention is to provide an apparatus capable of performing the necessary safety measures certainly when the detachable recording medium is ejected during data recording.

An object of the apparatus according to the present invention is to solve at least the problems described above. To achieve this and other objects, the apparatus capable of using a detachable recording medium comprises an electrical contact point that is electrically connected with the recording medium for a predetermined length in the insertion and ejection direction of the recording medium. An eject mechanism is incorporated to eject the recording medium. When the recording medium is being ejected from the apparatus a first detection device detects the ejecting movement of the recording medium at a first time that is earlier than the break time when the electrical contact point is electrically disconnected from the recording medium. And a second detection device detects the ejecting movement of the recording medium at a second time. The second time is earlier than the break time and later than the first time.

Other objects, advantages and salient features of the invention will become apparent from the detailed description taken in conjunction with the annexed drawings, which disclose preferred embodiments of the invention.

BRIEF DESCRIPTION OF THE DRAWINGS

The invention will be described with reference to the following drawings in which like reference numerals refer to like elements and wherein.

DETAILED DESCRIPTION OF PREFERRED EMBODIMENT

Figure 2:
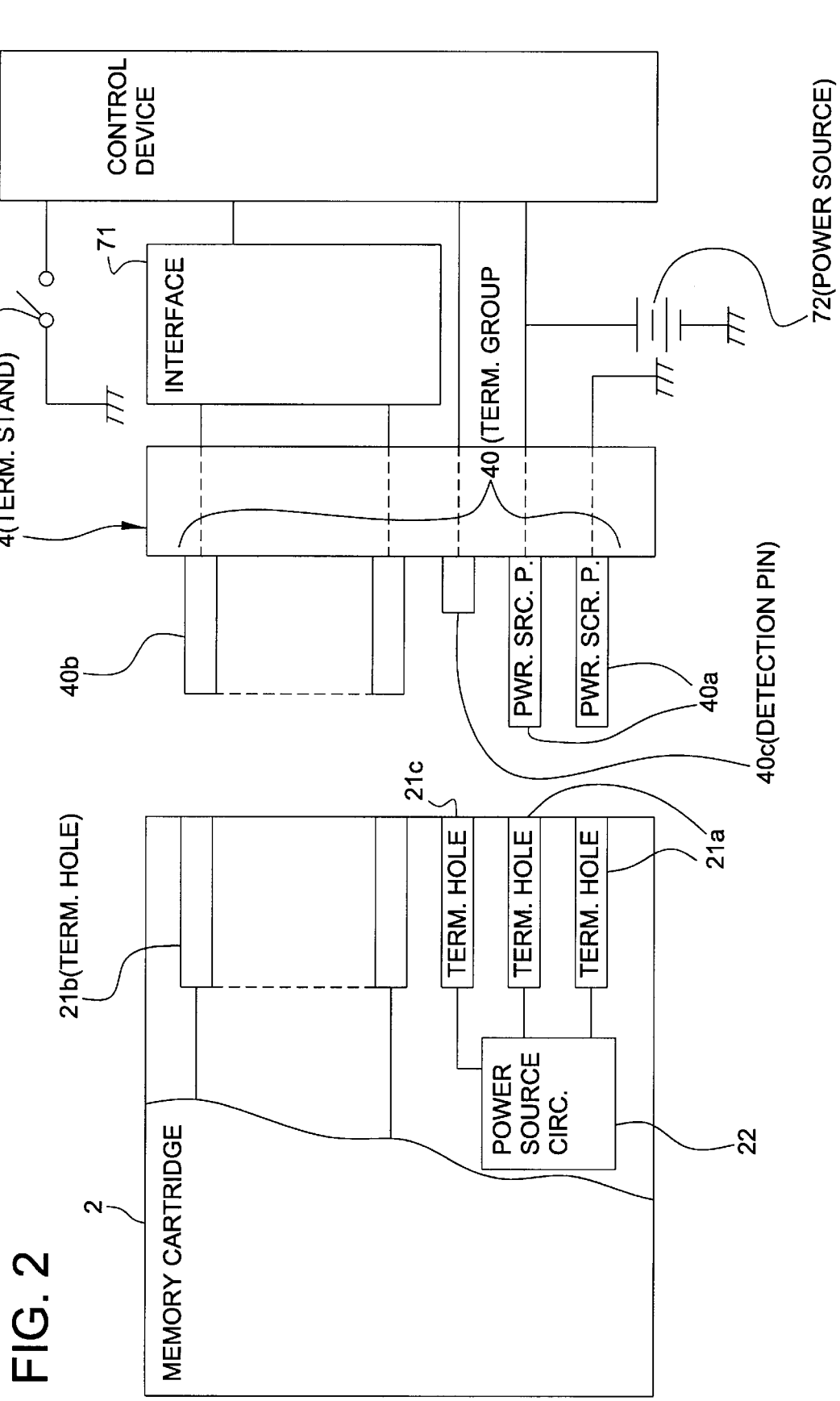
FIG. 2 is a block diagram showing the structure of the data recording component in the control system.
Figure 4:
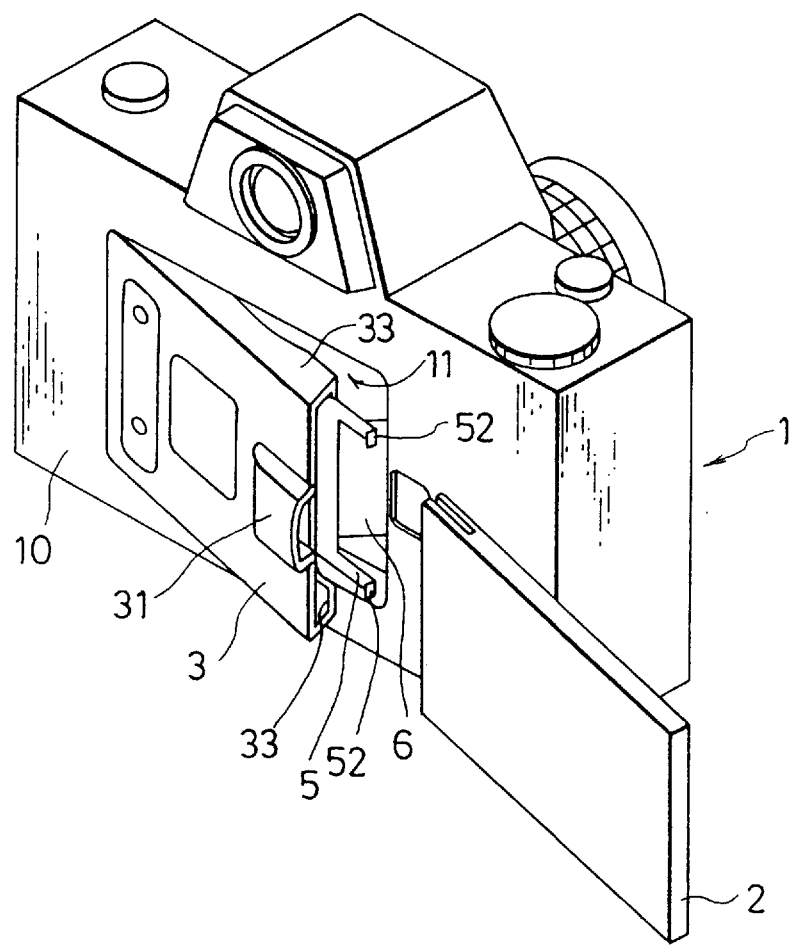
FIG. 4 is a perspective view viewed from the back side of the camera.
Figure 5:
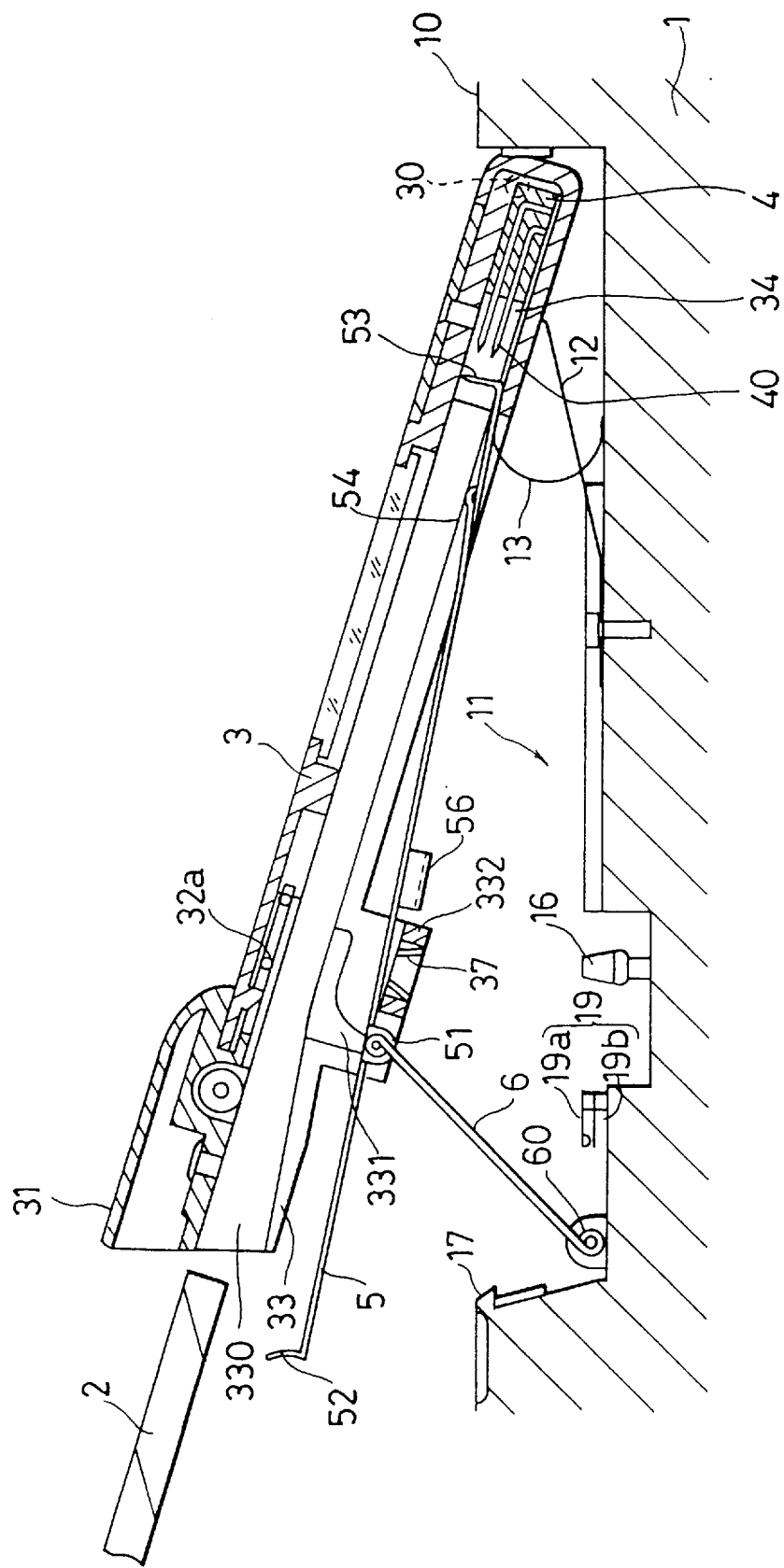
FIG. 5 is a diagram showing the door of the mounting chamber for the memory cartridge opened to the maximum extent.

The apparatus according to the preferred embodiments of the present invention is explained by application to an electronic still camera. The insertion and ejection of the memory cartridge in the electronic still camera (hereinafter "camera") of the first preferred embodiment is described with reference to FIGS. 4–8. As shown in FIG. 4, a mounting chamber 11 for a memory cartridge 2 is formed in the approximate center of a back surface 10 of a camera body 1. A door 3 is placed to cover the mounting chamber 11. As shown in FIG. 5, the door 3 is pivotably mounted to the camera body 1 with free rotation movement centered at a rotational movement axis 30. The door 3 is energized to open in an outward direction from the mounting chamber 11 by a plate spring 12. Hereafter, the rotation movement axis 30 side of the door 3 is referred to as a supporting point side, and the side opposite the rotation movement axis 30 is referred to as an edge side (left hand side as shown in FIG. 5). At the edge side of the door 3 on the exterior side, an attached knob 31 is capable of sliding in lateral directions for inserting and ejecting the memory cartridge 2. The knob 31 is energized toward the edge side of the door 3 by a spring 32a. On a pair of side walls 33 of the door 3, a pair of cartridge guiding grooves 330 extend in the directions of inserting and ejecting the memory cartridge 2 (only one side is shown in FIG. 5). A recessed component 34 is placed at the supporting point side of the door 3. A terminal stand 4 is mounted in the recessed component 34. At least terminal holes 21a, 21b and 21c of the memory cartridge 2 can be connected to the terminal pin group 40 in the recessed component 34. As shown in FIG. 2, a terminal pin group 40 is electrically mounted on the terminal stand 4. The terminal pin group 40 is connected to a control device 70. As shown in FIG. 5, the terminal pin group 40 is connected through a FPC (flexible printed circuit board) 13 to the control device 70 shown in FIG. 2, as explained in detail below.

A card driving plate 5 and a connection plate 6 are placed on an interior side of the door 3. The connection plate 6 is pivotably mounted to the bottom surface of the mounting chamber 11 to allow free rotation movement around an axis 60. The connection plate 6 and the card driving plate 5 are rotatably connected to allow free rotation movement around an axis 51. Both ends of the axis 51 are inserted into cam grooves 331 (only one side is shown in FIGS. 5–10) placed on the side walls 33 of the door 3. One edge of the card driving plate 5 is inserted into the recessed component 34 of the door 3. The memory cartridge 2 can be mounted (inserted) and dismounted (ejected) by the interlocking open and shut movement of the door 3 through the action of the card driving plate 5 and the connection plate 6.

Figure 6:
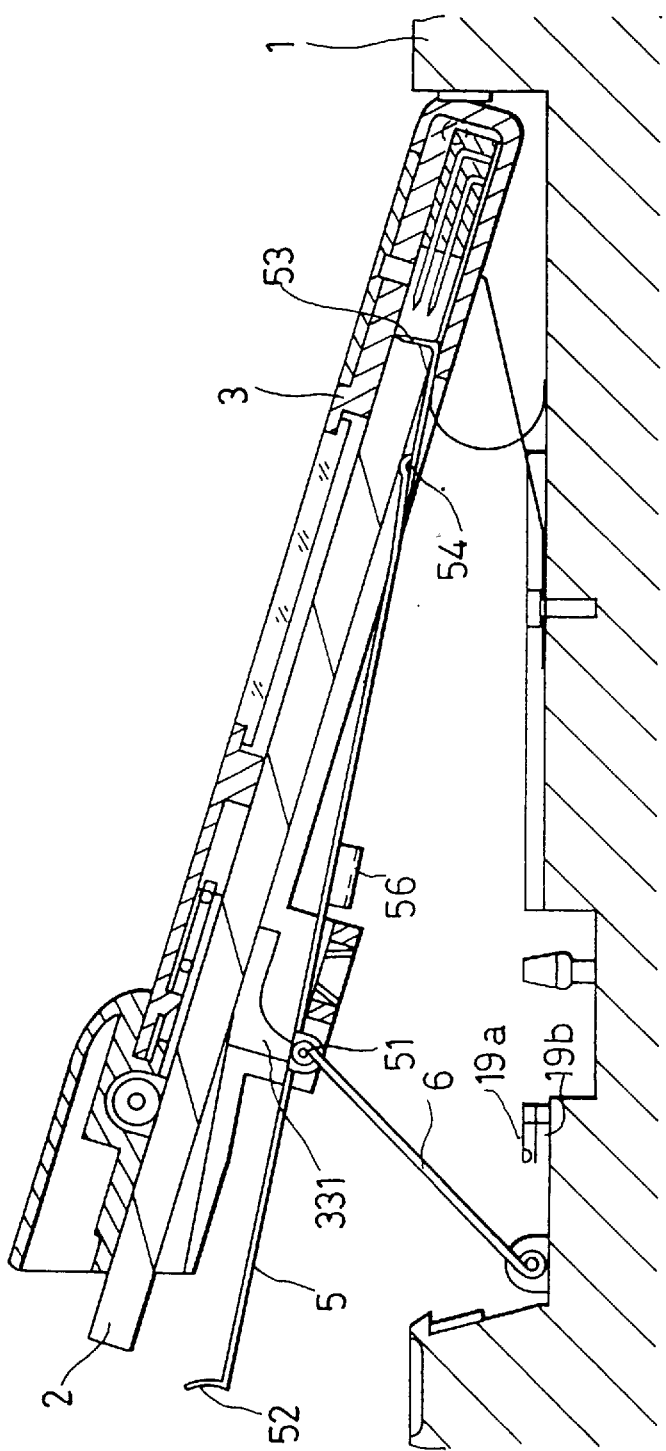
FIG. 6 is a diagram showing the memory cartridge inserted in the door shown in FIG. 5.

With reference to FIG. 5 and FIG. 6, the memory cartridge 2 is inserted into the cartridge guiding grooves 330 from the edge side of the door 3. As the door 3 is pushed in toward the mounting chamber 11 to close, the memory cartridge 2 is contained between a nail 52 and a nail 53 of the card driving plate 5. The door 3 is shown partially closed in FIG. 7. At this time, holding components 56 (only one side is shown in FIGS. 5–10) that are projected toward both sides of the card driving plate 5 are interlocked with the lower surfaces of the side walls 33 of the door 3. When the door 3 is further pushed toward closing from the condition shown in FIG. 7, the holding components 56 of the card driving plate 5 are pushed down by the door 3. Combined with the holding components 56 pushed down, the connection plate 6 is rotated in the clockwise direction centered at the axis 60, and the axis 51 is moved along the cam grooves 331. Further, the card driving plate 5 is moved toward the supporting point side of the door 3. As a result, the memory cartridge 2 is pushed in toward the terminal stand 4 by the nail 52, and the terminal pin group 40 is inserted into the terminal holes of the memory cartridge 2 to form an electrical contact point.

Figure 8:
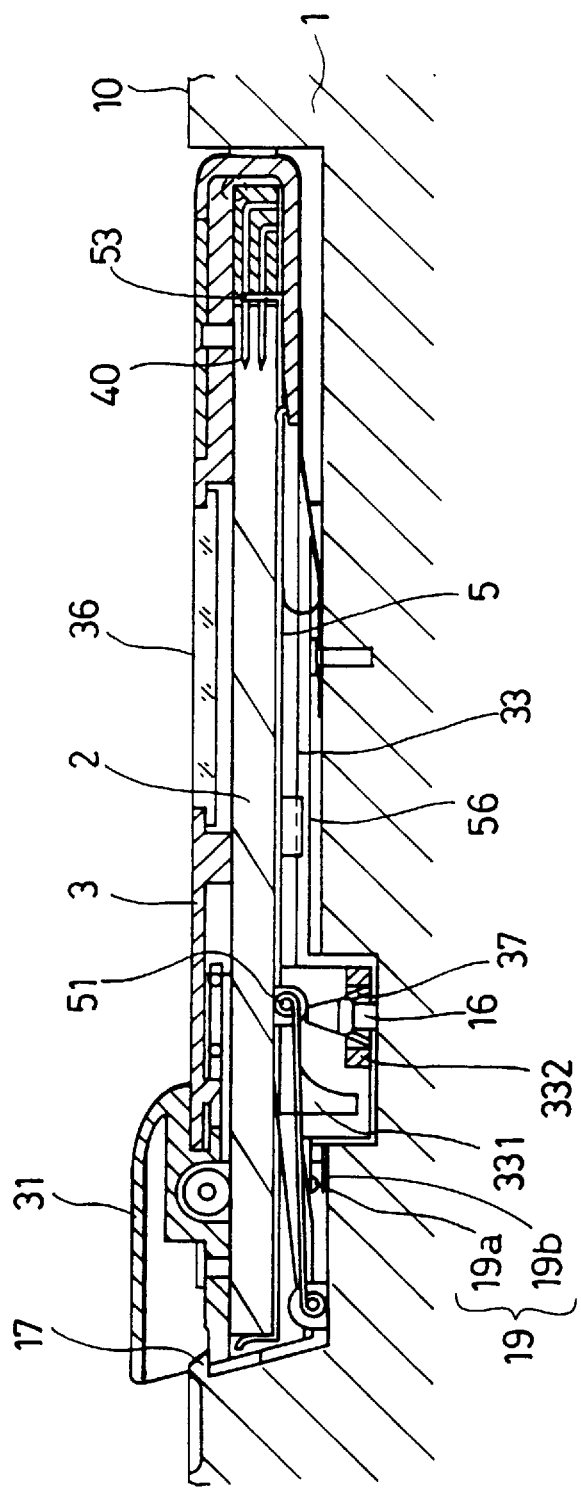
FIG. 8 is a diagram showing the door in FIG. 5 completely closed.

As shown in FIG. 8, the knob 31 interlocks with a projected component 17 of the camera body 1 to prevent the door 3 from opening. A ring 37 made of an elastic material is mounted to an integrated joint 332 attached to the door 3. A pin 16 including a step portion on the bottom surface of the mounting chamber 11 is inserted into the ring 37.

Therefore, the door 3 cannot be opened immediately even when the knob 31 is incorrectly operated in the opening direction away from the projected component 17 to separate the knob 31 from the projected component 17. A plate spring 54 pushes the memory cartridge 2 to the door 3.

When the knob 31 is released from interlocking with the projected component 17 by sliding toward the supporting point side of the door 3, the door 3 is opened by pulling the pin 16 through the ring 37. The card driving plate 5 moves toward the edge side of the door 3. As a result, the memory cartridge 2 is detached from the terminal pin group 40 by the nail 53 of the card driving plate 5 and it is carried to the position shown in FIG. 6. In the state shown in FIG. 6, the user of the camera is able to hold the memory cartridge 2 and extract it from the cartridge guiding grooves 330. The removing operation is the reverse of the mounting operation described above.

With reference to FIGS. 5–8, a limit switch 19 is attached to the bottom surface of the mounting chamber 11. As shown in FIG. 8, the side wall 33 of the completely closed door 3 forces a contact point 19a of a limit switch 19 to contact a contact point 19b. When the door 3 is slightly opened, the contact point 19a and the contact point 19b are separated from each other. Hereafter, the condition when the contact point 19a contacts the contact point 19b is referred to as ON, and the condition when the contact point 19a and the contact point 19b are separated from each other is referred to as OFF. The detailed explanation of the timing of ON and OFF is given below.

Figure 1A:
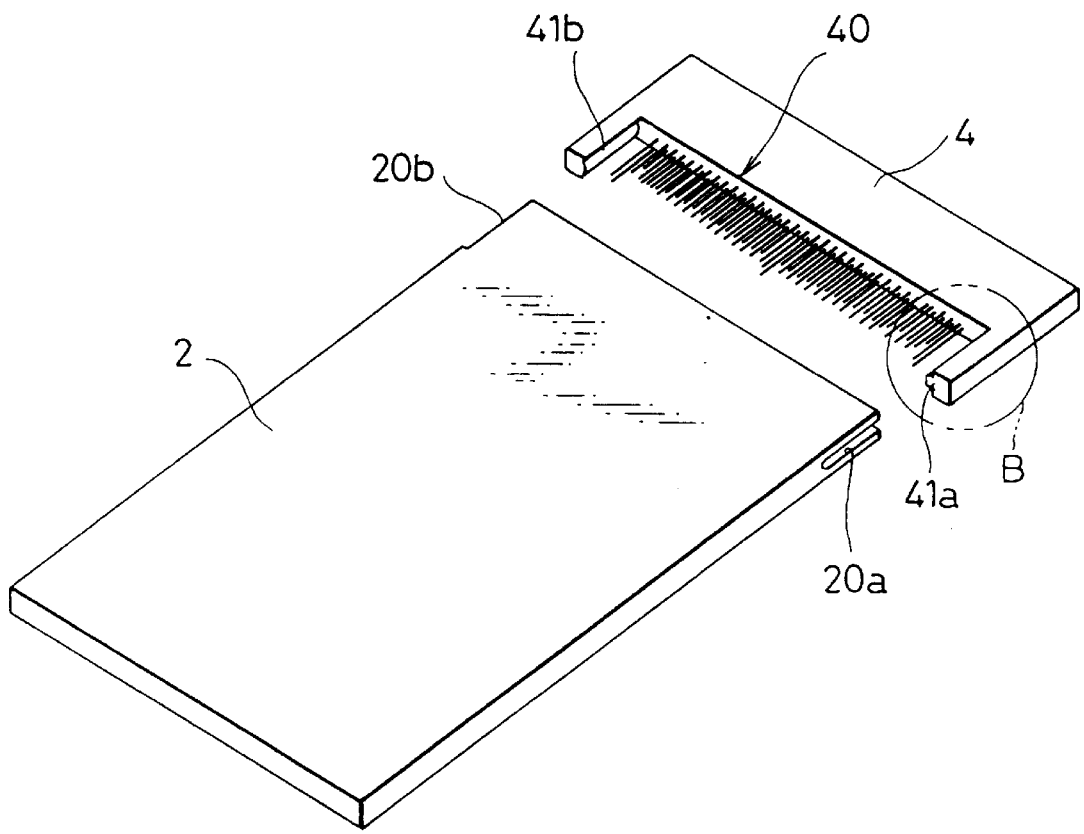
FIG. 1A is a perspective view showing a memory cartridge and a terminal stand from a camera of the present invention.
Figure 9:
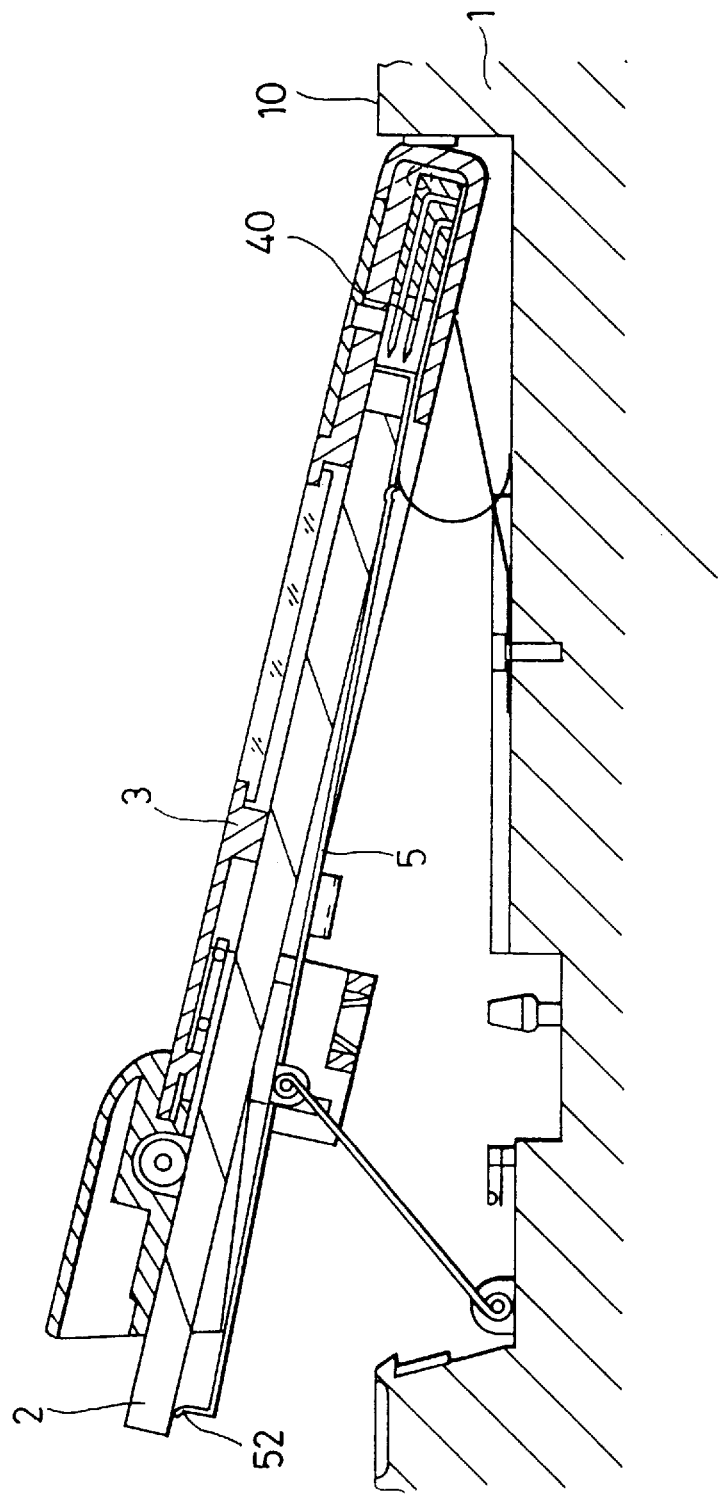
FIG. 9 is a diagram showing the memory cartridge inserted in the wrong direction in the door shown in FIG. 5.
Figure 10:
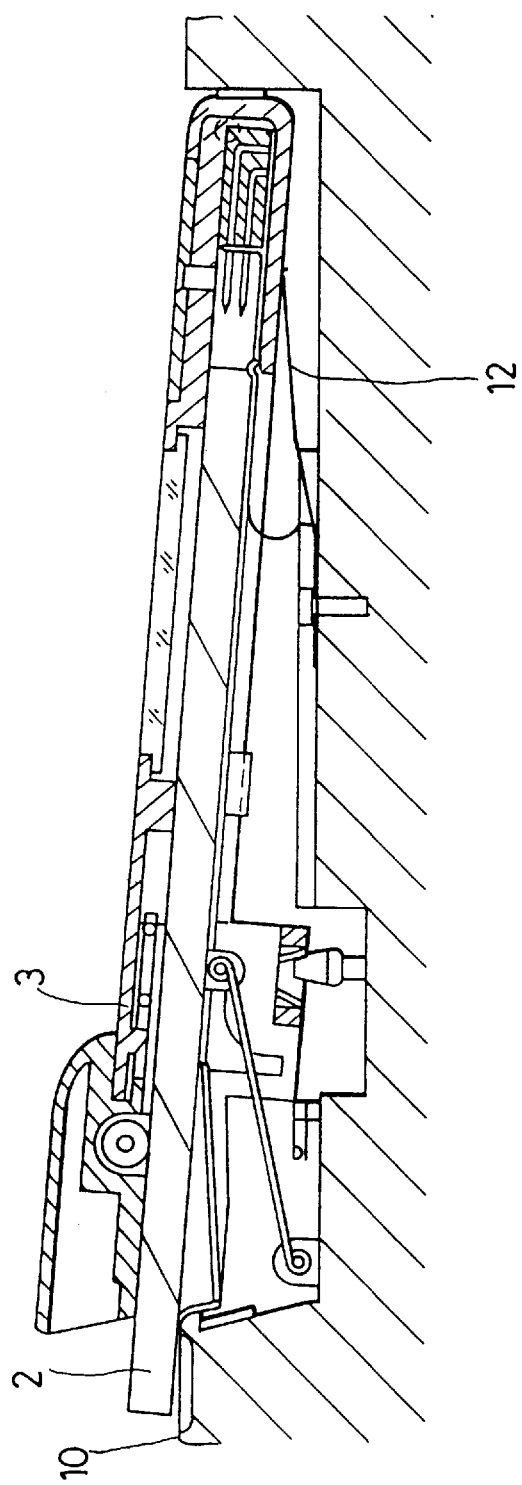
FIG. 10 is a diagram showing the door in FIG. 9 closed.

As shown in FIG. 1A, at both edges of the terminal stand 4, convex components 41a and 41b interlock when inserted into recessed components 20a and 20b, which are placed at both sides of the memory cartridge 2. The recessed components 20a and 20b and the convex components 41a and 41b are at least non-symmetrical with regard to left-to-right symmetry. Therefore, if the memory cartridge 2 is inserted incorrectly by inverting the recessed component edges, the convex components 41a and 41b cannot be inserted into the recessed components 20a and 20b, as shown in FIGS. 9–10. Therefore, the memory cartridge 2 cannot be incorrectly inserted into the recessed component 34. When the memory cartridge 2 is inserted with any incorrect orientation, the result is the same. When the insertion of the memory cartridge is incorrect, the memory cartridge 2 is stopped at a position before interlocking with the nail 52, as shown in FIG. 9. Trying to push the door 3 closed in that condition, pinches the memory cartridge 2 between the door 3 and the back surface 10 of the camera body 1, as shown in FIG. 10. Further, the nail 53 of the card driving plate 5 is forced into the space between the terminal pin group 40 and the convex components 41a and 41b.

Figure 1B:
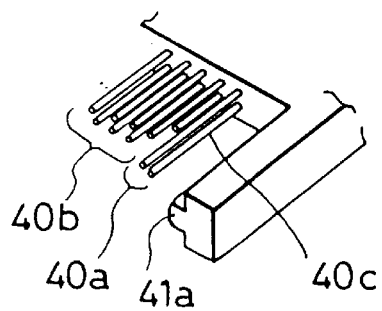
FIG. 1B is a perspective view showing of the B section in FIG. 1A.
Figure 7:
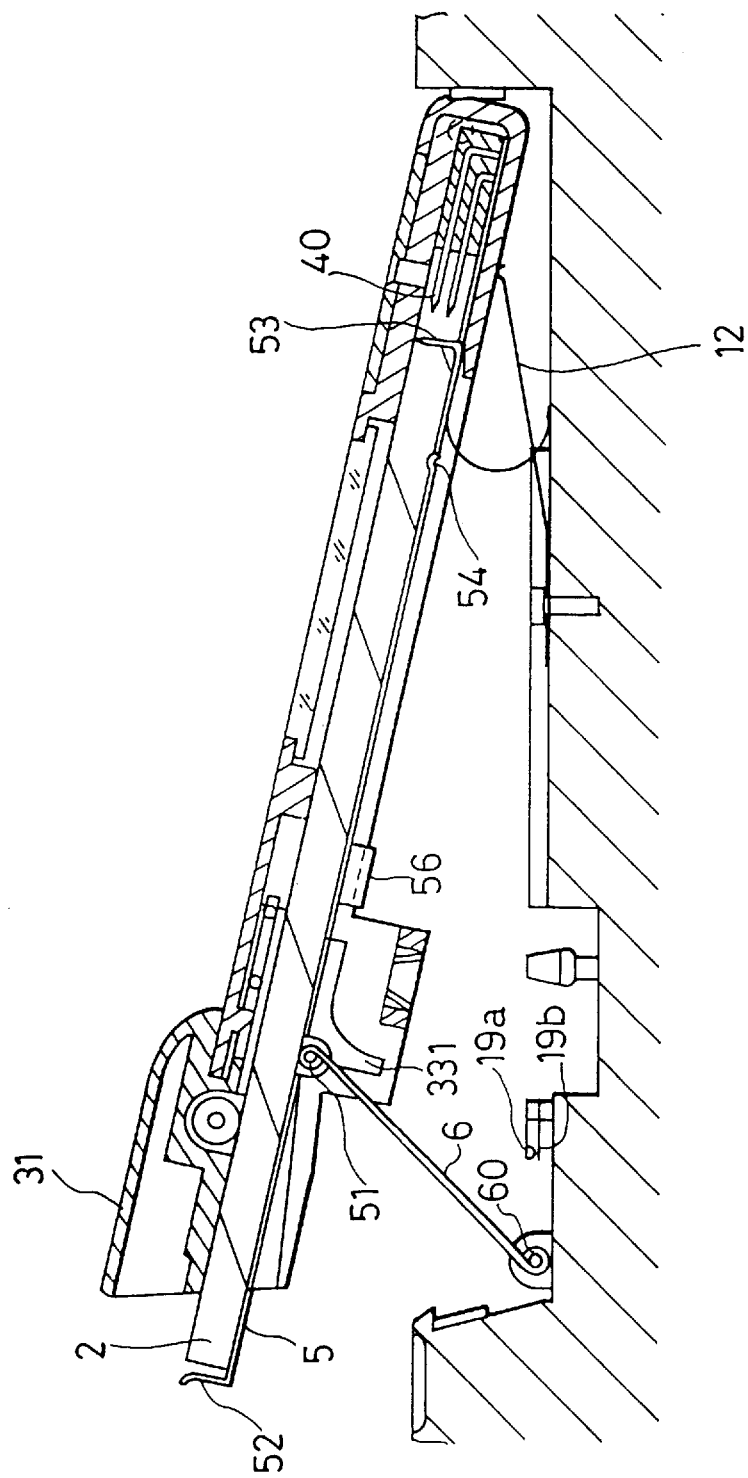
FIG. 7 is a diagram showing the door in FIG. 6 slightly more closed.

As shown in FIG. 1B, two pieces comprise the electric source pins 40a that supply the power source to the memory cartridge 2. A plurality of signal pins 40b transfer data between the camera and the memory cartridge 2. The pin 40c detects the connection of the memory cartridge 2 to the camera. The pins 40a, 40b and 40c are included in the terminal pins group 40. The power source pin 40a are the longest, the signal pin 40b has the next longest length, and the detection pin 40c is the shortest. The length is measured in the direction from the supporting point side to the edge side. Therefore, when the memory cartridge 2 is removed from the mounting chamber 11, the contact between the detection pin 40c and the memory cartridge 2 is disconnected first. Subsequently the contact of the signal pin 40b is disconnected. Finally, the contact with the power source pins 40a is disconnected. The timing of the limit switch 19 changing from ON to OFF, controlled by the opening movement of the door 3, is set earlier than the disconnection of the detection pin 40c as shown in FIG. 7.

FIG. 2 shows the structure of the data transfer component with the memory cartridge 2. The control device 70 includes a micro-computer, with peripheral devices such as a memory. The control device 70 performs various types of control such as photographic movement control or image data compression control as well as data recording control for the memory cartridge 2. However, only the components relating to data recording control are shown in FIG. 2. The signal pin 40b of the terminal stand 4 is connected through the interface 71 for data transfer to the control device 70. The limit switch 19 and the detection pin 40c are also connected to the control device 70. One of the pair of power source pins 40a is grounded and the other is connected to the power source 72. Each of the terminal holes 21a, 21b and 21c are formed on the memory cartridge 2 so that the pins 40a, 40b and 40c can be inserted. The terminal holes 21c receiving the detection pins 40c are connected to the grounded side of the single pair of the terminal holes 21a for the power source supply through the power source circuit 22. For that reason, when the contact of the terminal hole 21c with the detection pin 40c is disconnected, the electric potential of the detection pin 40c is pulled up to an H level. When the detection pin 40c and the terminal hole 21c are connected, the electric potential of the detection pin 40c is reduced to an L level. Therefore, the existence of the memory cartridge 2 can be distinguished by the electric potential of the detection pin 40c. Further, as shown in FIG. 2, the length of the terminal holes 21a, 21b and 21c are the same. Alternatively, the terminal hole lengths can correspond to the length of the pins 40a, 40b and 40c.

The camera controller can be implemented as a single special purpose integrated circuit (e.g., ASIC) having a main or central processor section for overall, system-level control, and separate sections dedicated to performing various different specific computations, functions and other processes under control of the central processor section. It will be appreciated by those skilled in the art that the controller can also be implemented using a plurality of separate dedicated or programmable integrated or other electronic circuits or devices (e.g., hardwired electronic or logic circuits such as discrete element circuits, or programmable logic devices such as PLDs, PLAs, PALs or the like). The controller can also be implemented using a suitably programmed general purpose computer, e.g., a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the flowcharts shown in FIG. 3 can be used as the controller. As shown, a distributed processing architecture is preferred for maximum data/signal processing capability and speed.

Figure 3:
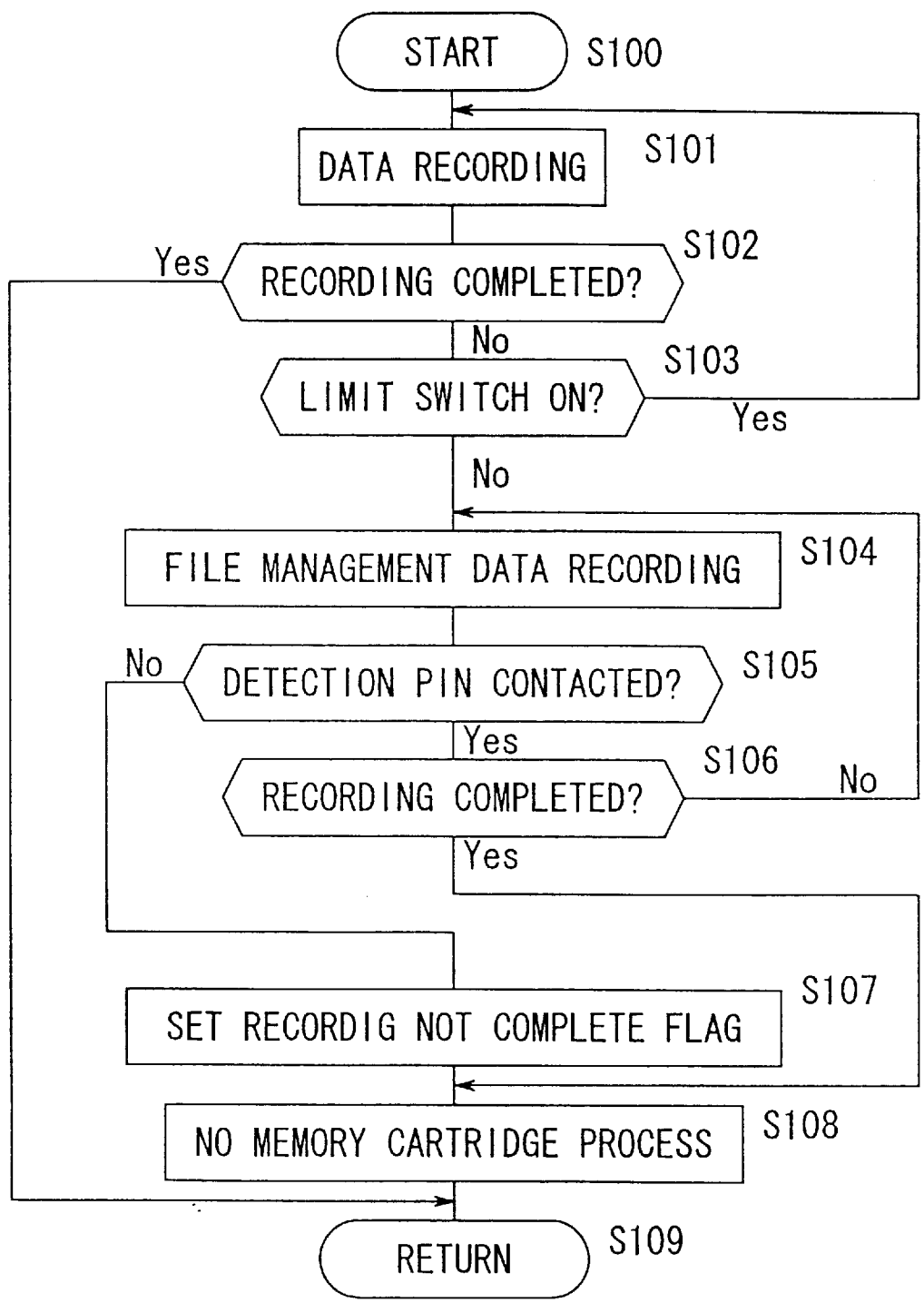
FIG. 3 is a flow chart showing the data recording process being implemented in the control system of FIG. 2.

One preferred process for controlling data recording into the memory cartridge 2 by the control device 70 is shown in FIG. 3. When the data recording to the memory cartridge 2 is ordered, the control device 70 performs the data recording program as a cut-in or interrupt process. After beginning in step S100, data recording is started in step S101 using the signal pin 40b. In step S102, it is determined whether data recording is completed. If data recording is still under way in step S102, it is determined in step S103 whether the limit switch 19 is ON. If the limit switch is ON, the control device 70 returns to step S101, and the data recording process continues.

If it is determined in step S103 that the limit switch 19 is OFF (it means the starting of the opening movement of the door 3), when the data recording process is under way, recording specified file management data concerning the file being data recorded is started in step S104. In step S105, it is determined whether the detection pin 40c and the terminal hole 21c of the memory cartridge 2 are connected. If the detection pin 40c and the terminal hole 21c are connected, it is determined in step S106 whether recording of the file management data is completed. If the recording of the file management data is completed, the control device 70 continues to step S108. However, if the process of recording is still under way, the control device 70 returns to step S104 and continues recording the file management data.

When it is determined in step S105 that the detection pin 40c is disconnected during the file management data recording, the control device 70 continues to step S107. In step S107, the recording not complete flag is set for the file currently being processed for data recording. The flag indicates at a minimum that the data recording has not been completed. Therefore, although additional information about the quality or quantity of file management data that was recorded can be included in the recording not complete flag, the data quantity of one bit is sufficient. Therefore, the recording not complete flag can itself be recorded through the signal pin 40b in the short span of time from when the detection pin 40c is disconnected to the time when the signal pin 40b is disconnected. Step S108 completes the process in the camera corresponding to the memory cartridge removal. After completing the process in Step 107, the control device 70 continues to step S108. In step S108, the process corresponding to the non existence of the memory cartridge is executed. When the process in step S108 is completed, or when it is determined in step S102 that data recording is completed, the data recording program concludes and in step S109, returns to the control device 70 process in progress before interruption by the data recording cut-in process.

In the first preferred embodiment, when the removing movement of the memory cartridge 2 is detected by the limit switch 19 before the terminal pin 40 group begins to detach, recording of the file management data is started. Therefore, the probability that the file management data is completely recorded is very high compared to the case where the file management data recording starts after detecting the disconnection of the detection pin 40c. Further, a delay can be created from the time when the door 3 starts opening to the time when the card driving plate 5 starts moving toward the edge side of the door 3. The delay can be constructed by the looseness of the insertion section of the axis 51 or the axis 60, for example. Therefore, sufficient time for the complete recording of the file management data occurs between when the limit switch 19 transition to OFF and the detection pin 40c disconnect.

The recording of the recording not complete flag can be a flag in the file management data. The file recording not complete flag can combine with file management data to provide sufficient information to repair the file management data using commercially available file maintenance software. In contrast, the case where the file management data recording starts after detecting the detection pin 40c, no information can be recorded into the memory cartridge 2 when the signal pin 40b detaches during file management data recording, so that insufficient data is recorded to the memory cartridge 2. Thus, file management data repair is not possible.

The power source pin 40a contacts the memory cartridge 2 for the longest time of all the pins. Therefore, the possibility for destroying data by power source loss during recording of the recording not complete flag is eliminated. Even if the electric potential difference between the attached memory cartridge 2 and the terminal pin group 40 becomes greater due to the static electrification, the power source pin 40a, being relatively strong in view of voltage, makes initial contact with the memory cartridge 2 to equalize both of the electric potentials. Then, the signal pin 40b is contacted. Therefore, the possible destruction of the electronic component, being relatively weak in view of the voltage, in the memory cartridge 2 is eliminated.

The length of the pins 40a, 40b and 40c can be changed, and the timing to disconnecting the terminal pin group 40 from the memory cartridge 2 is correspondingly adjusted. However, the present invention is not limited to the embodiment described above. For example, even if the length of the pins 40a, 40b and 40c are equal, the length of the electrical contact area of the memory cartridge 2 terminal hole can be varied to correspond to the pin types. Thus, the disconnection timing of the disconnection of each pin 40a, 40b and 40c, although equal in length, can be changed. Further, the terminal stand 4 can be divided into the three types of the terminal stands that respectively conain one of pins 40a, 40b and 40c, and respective types of the terminal stands can be removed by the opening movement of the door 3 in the desired order. However, the first preferred embodiment with the pins varying in length and one terminal stand is advantageous to make a compact device or to reduce the production cost.

In the first preferred embodiment, the door 3 opening movement is detected by the limit switch 19, however, the eject movement can be quickly detected using the slide operation of the knob 31. Additionally, if a device component can be moved with the interlocking operation of the door 3 opening movement, the component can be used to detect the opening movement. In the case that the eject structure is structured separately from the door 3 or the memory cartridge is otherwise accessed, a device corresponding the method and configuration of the present invention can be used. Further, the present invention can be applied to a device other than the electronic still camera. As an alternative to detecting the disconnect of the detection pin 40c, the door 3 opening movement can be detected in two steps.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. An apparatus capable of using a detachable recording medium, comprising:
    an electrical contact point that is electrically connected with said recording medium for a predetermined length in an insertion and ejection direction of said recording medium;
    an eject mechanism enabling said recording medium to be ejected from said apparatus;
    a first detection device that detects at a first time an ejecting movement by said eject mechanism, said first time being earlier than a break time when said electrical contact point is electrically disconnected from said recording medium; and
    a second detection device that detects at a second time said ejecting movement by said eject mechanism, said second time being earlier than said break time, said second time being later than said first time.

2. An apparatus according to claim 1, further comprising a recording control device that controls data recording to said recording medium, wherein upon detecting said ejecting movement by said first detection device, said recording control device starts recording a first information to said recording medium, and upon detecting said ejecting movement by said second detection device, said recording control device starts recording a second information to said recording medium.

3. The apparatus according to claim 2, wherein said control device records said first and second information after said first and second detection devices detect said ejecting movement respectively when said control device records substantial data of said apparatus.

4. An apparatus according to claim 1, wherein said first detection device detects a displacement of said eject mechanism caused by said ejecting movement.

5. An apparatus according to claim 1, wherein said second detection device comprises:
    an ejection detection contact point that is electrically connected with said recording medium being inserted and that is electrically disconnected at said second time from said recording medium caused by said ejecting movement; and
    a determination component that determines whether said ejection detection contact point is electrically connected with said recording medium.

6. An apparatus according to claim 1, further comprising a power source contact point that enables supplying a power source to said recording medium, wherein said power source contact point is electrically connected with said recording medium before said electrical contact point is electrically connected with said recording medium when said recording medium is inserted, and said power source contact point is electrically disconnected from said recording medium after said electrical contact point is electrically disconnected from said recording medium when said recording medium is ejected.

7. An apparatus according to claim 1, further comprising a control device that carries a first action upon detecting said ejecting movement by said first detection device and a second action upon detecting said ejecting movement by said second detection device.

8. An apparatus capable of using a detachable recording medium, comprising:
    a first electrical contact point that is electrically connected with said recording medium being inserted;
    a second electrical contact point that is electrically connected with said recording medium being inserted and that is electrically disconnected from said recording medium before said first electrical contact point is electrically disconnected from said recording medium when said recording medium is ejected;
    an eject mechanism enabling said recording medium to be ejected; and
    an ejecting movement detection device that detects an ejecting movement of said recording medium before said first electrical contact point is electrically disconnected and at a different time than when said second electrical contact point is electrically disconnected from said recording medium.

9. An apparatus according to claim 8, wherein said ejecting movement detection device detects said ejecting movement at a designated time being earlier than when said second electrical contact point is electrically disconnected from said recording medium.

10. An apparatus according to claim 9, further comprising:
a determination device that determines whether said second electrical contact point is electrically connected with said recording medium; and
a recording control device that starts recording a first information to said recording medium using said first electrical contact point upon detecting said ejecting movement by said ejecting movement detection device and that starts recording a second information to said recording medium using said first electrical contact point when said determination device determines that said second electrical contact point is electrically disconnected from said recording medium.

11. The apparatus according to claim 10, wherein said control device records said first and second information after said first and second detection devices detect said ejecting movement respectively when said control device records substantial data of said apparatus.

12. An apparatus according to claim 8, wherein said first electrical contact point and said second electrical contact point are pins insertable into said recording medium, said first electrical contact point being longer than said second electrical contact point.

13. An apparatus according to claim 8, further comprising a third electrical contact point that is electrically connected with said recording medium before said first electrical contact point is electrically connected with said recording medium when said recording medium is being inserted and that is electrically disconnected from said recording medium after said first electrical contact point is electrically disconnected from said recording medium when said recording medium is being ejected.

14. An apparatus according to claim 13, further comprising a power source supply device that supplies a power source to said recording medium through said third electrical contact point.

15. An apparatus according to claim 8, wherein said eject mechanism comprises:
an operational component movable in a designated direction to enable said recording medium to be ejected; and
a change mechanism that changes an operation of said operational component in said designated direction to said ejecting movement of said recording medium.

16. An apparatus according to claim 15, further comprising:
a mounting chamber configured to receive said recording medium; and
a lid component that moves between an open state of said mounting chamber and a closed state of said mounting chamber, said lid component comprising said operational component of said eject mechanism.

17. An apparatus according to claim 8, further comprising:
a determination device that determines whether said second electrical contact point is electrically connected with said recording medium; and
a control device that carries a first action upon detecting said ejecting movement by said ejecting movement detection device and carries a second action when said determination device determines that said second electrical contact point is electrically disconnected from said recording medium.

18. An apparatus capable of using a detachable recording medium, comprising:
a mounting chamber configured to receive said recording medium;
a lid component movable between an open state of the mounting chamber and a closed state of said mounting chamber, wherein insertion and ejection of said recording medium are possible in said open state;
a first electrical contact point that is electrically connected with said recording medium;
a second electrical contact point that is electrically connected with said recording medium inserted into said mounting chamber, said second contact point being electrically disconnected from said recording medium before said first electrical contact point is electrically disconnected from said recording medium when said recording medium is ejected; and
an opening movement detection device that detects a movement of said lid component to said open state.

19. An apparatus according to claim 18, further comprising:
a determination device that determines whether said second electrical contact point is electrically connected with said recording medium; and
a control device that starts recording a first information to said recording medium using said first electrical contact point upon detecting movement of said lid component by said opening movement detection device and starts recording a second information to said recording medium using said first electrical contact point when said determination device determines that said second electrical contact point is electrically disconnected from said recording medium.

20. The apparatus according to claim 18, wherein said control device records said first and second information after said first and second detection devices detect said ejecting movement respectively when said control device records substantial data of said apparatus.

21. An apparatus capable of using a detachable recording medium, comprising:
a mounting chamber configured to receive said recording medium;
a first terminal pin insertable into a first terminal hole of said recording medium when said recording medium is inserted into said mounting chamber, wherein when said recording medium is ejected from said mounting chamber said first terminal pin is extracted from said first terminal hole;
a second terminal pin insertable into a second terminal hole of said recording medium after said first terminal pin is inserted into said first terminal hole when said recording medium is being inserted into said mounting chamber, wherein when said recording medium is ejected from said mounting chamber, said second terminal pin is extracted from said second terminal hole before said first terminal pin is extracted from said first terminal hole;
a determination device that determines whether said second terminal pin connects with said second terminal hole;
an operational component movable in a designated direction to enable said recording medium to be ejected from said mounting chamber;
a change mechanism that changes an operation of said the operational component in said designated direction to an ejecting movement of said recording medium;

an ejecting operation detection device that detects said operation of said operational component toward said designated direction before said second terminal pin is extracted from said second terminal hole when said recording medium is being ejected; and a recording control device that starts recording a first information to said recording medium through said first terminal pin when said ejecting operation detection device detects said operation of said operational component and that starts recording a second information to said recording medium through said first terminal pin when said determination device determines that said second terminal pin and said second terminal hole are disconnected.

22. An apparatus capable of using a detachable recording medium, comprising:

a mounting chamber configured to receive said recording medium;

a first terminal pin insertable into a first terminal hole of said recording medium when said recording medium is inserted into said mounting chamber, wherein when said recording medium is ejected from said mounting chamber said first terminal pin is extracted from said first terminal hole;

a second terminal pin insertable into a second terminal hole of said recording medium after said first terminal pin is inserted into said first terminal hole when said recording medium is being inserted into said mounting chamber, wherein when said recording medium is ejected from said mounting chamber, said second terminal pin is extracted from said second terminal hole before said first terminal pin is extracted from said first terminal hole;

a third terminal pin insertable into a third terminal hole of said recording medium before said first terminal pin is inserted into said first terminal hole when said recording medium is inserted into said mounting chamber, wherein when said recording medium is ejected from said mounting chamber said third terminal pin is extracted from said third terminal hole after said first terminal pin is extracted from said first terminal hole;

a determination device that determines whether said second terminal pin connects with said second terminal hole;

a power source supply device that supplies a power source to said recording medium through said third terminal pin;

an operational component movable in a designated direction to enable said recording medium to be ejected from said mounting chamber;

a change mechanism that changes an operation of said operational component in said designated direction to an ejecting movement of said recording medium;

an ejection operation detection device that detects said operation of said operational component toward said designated direction before said second terminal pin is extracted from said second terminal hole; and a recording control device that starts recording a first information to said recording medium through said first terminal pin when said ejection operation detection device detects said ejecting movement of said recording medium and starts recording a second information to said recording medium through said first terminal pin when said determination device determines that said second terminal pin and said second terminal hole are disconnected.

23. An apparatus capable of using a detachable recording means for recording, comprising:

electrical contact means for being electrically connected with said recording medium when said recording means is mounted;

dismounting means for enabling said recording means to be dismounted from said apparatus;

first detection means for detecting a recording means dismounting event at a first time, said first time being earlier than break time when said electrical contact means is electrically disconnected from said recording means; and second detection means for detecting said recording means dismounting event at a second time, said second time being earlier than said break time, said second time being later than said first time.

24. An apparatus according to claim 23, comprising recording control means for controlling data recording to said recording means, wherein upon detecting said recording means dismounting event by said first detection means, said recording control device starts recording a first information to said recording means, and upon detecting said recording means dismounting event by said second detection means, said recording control device starts recording a second information to said recording means.

25. The apparatus according to claim 24, wherein said control device records said first and second information after said first and second detection devices detect said ejecting movement respectively when said control device records substantial data of said apparatus.

26. An apparatus according to claim 23, wherein a power source supplying means for supplying a power source to said recording means is disconnected from said recording means later than said break time when said recording means is dismounted.

27. An apparatus according to claim 26, wherein said electrical contact means is a pin insertable into said recording means and capable of carrying a data signal;

said second detection means is a pin insertable into said recording means; and said power source supplying means is a pin insertable into said recording means.

28. An apparatus according to claim 23, wherein said dismounting means comprises:

operational means for enabling dismounting of said recording means movable in a designated direction; and change means for changing an operation of said operational means in said designated direction to said recording means dismounting events.

29. An apparatus according to claim 28, further comprising:

mounting means configured for receiving said recording means; and lid component means for moving between an open state of said mounting means and a closed state of said mounting means, said lid component means comprising said dismounting means.

30. An apparatus according to claim 23, further comprising a control means for carrying a first action upon detecting said recording means dismounting event by said first detection means and a second action upon detecting said recording means dismounting event by said second detection means.

31. A method for ejecting a detachable recording medium from an apparatus during data recording, comprising the steps of:

electrically disconnecting said recording medium from said apparatus when said recording medium is ejected;

detecting at a first time a recording medium ejecting event, said first time being earlier than break time when said recording medium is electrically disconnected from said apparatus; and detecting at a second time said recording medium ejecting event, said second time being earlier than said break time, said second time being later than said first time.

32. A method of claim 31, wherein said step of detecting at said first time comprises detecting a displacement of said eject mechanism, and said step of detecting at said second time comprises detecting a electrical disconnecting of said recording medium.

33. A method of claim 31, further comprising the step of controlling data recording to said recording medium, wherein upon detecting said recording medium ejecting event at said first time, a first information is recorded to said recording medium, and upon detecting said recording medium ejecting event at said second time, a second information is recorded to said recording medium.

34. A method of claim 31, wherein a power supply to said recording medium is broken at the latest time for the period of time when said recording medium is electrically disconnecting from said apparatus.

35. A method of claim 31, wherein said electrically disconnecting step comprises the steps of:

disconnecting an ejection detection contact pin for carrying a detection signal at said second time;

disconnecting a data recording contact pin for carrying a data signal; after disconnecting said ejection detection contact pin; and disconnecting a power supplying contact pin for supplying a power source after disconnecting said data recording contact pin.

36. A method according to claim 31, wherein said step of detecting at a first time a recording medium ejecting event is in response to said recording medium being ejected; and said method further comprises the step of carrying out a first action at said first time and a second action at said second time.

37. A method according to claim 36, said step of carrying out a first action at said first time and a second action at said second time comprising a step of controlling data recording to said recording medium, wherein upon detecting said recording medium ejecting event at said first time, the first information is recorded to said recording medium in said first action, and upon detecting said recording medium ejecting event at said second time, a second information is recorded to said recording medium in said first action.

* * * * *